(12) United States Patent
Marty et al.

(10) Patent No.: US 7,553,369 B2
(45) Date of Patent: Jun. 30, 2009

(54) METHOD OF ALTERING THE PROPERTIES OF A THIN FILM AND SUBSTRATE IMPLEMENTING SAID METHOD

(75) Inventors: Olivier Marty, Lyons (FR); Volodymyr Lysenko, Villeurbanne (FR)

(73) Assignee: Universite Claude Bernard Lyon 1, Villeurbanne Cedex (FR)

(*) Notice: Subject to any disclaimer, the term of this patent is extended or adjusted under 35 U.S.C. 154(b) by 243 days.

(21) Appl. No.: 10/512,077

(22) PCT Filed: May 7, 2003

(86) PCT No.: PCT/FR03/01423

§ 371 (c)(1),
(2), (4) Date: Dec. 9, 2004

(87) PCT Pub. No.: WO03/099707

PCT Pub. Date: Dec. 4, 2003

(65) Prior Publication Data

US 2005/0229837 A1 Oct. 20, 2005

(30) Foreign Application Priority Data

May 7, 2002 (FR) .................................. 02 05731

(51) Int. Cl.
*C30B 23/00* (2006.01)
*C30B 25/00* (2006.01)
(52) U.S. Cl. ............................. 117/88; 117/89; 117/90; 117/91; 117/92; 977/811; 977/825; 977/832
(58) Field of Classification Search ............. 117/88–92; 977/811, 825, 832
See application file for complete search history.

(56) References Cited

U.S. PATENT DOCUMENTS 3,607,269 A * 9/1971 Young ........................ 430/232

(Continued)

FOREIGN PATENT DOCUMENTS

EP    10 258273    3/2000

(Continued)

OTHER PUBLICATIONS

Romanov S I et al: "GESI Films With Reduced Dislocation Density Grown by Molecular-Beamepitaxy on Compliant Substrates Based on Porous Silicon" Applied Physics Letters, American Institute of Physics, New York, US, vol. 75, No. 26, Dec. 27, 1999, pp. 4118-4120, XP000902592.*

(Continued)

*Primary Examiner*—Robert M Kunemund
*Assistant Examiner*—G. Nagesh Rao
(74) *Attorney, Agent, or Firm*—Dennison, Schultz & MacDonald

(57) ABSTRACT

The invention relates to a process for modifying the properties of a thin layer (1) formed on the surface of a support (2) forming a substrate (3) utilised in the field of microelectronics, nanoelectronics or microtechnology, nanotechnology, characterised in that it consists of:
  forming at least one thin layer (1) on a nanostructured support with specific upper surface (2),
  and treating the nanostructured support with specific upper surface (2) to generate internal strains in the support causing its deformation at least in the plane of the thin layer so as to ensure corresponding deformation of the thin layer to modify its properties.

11 Claims, 3 Drawing Sheets

U.S. PATENT DOCUMENTS

| | | | |
|---|---|---|---|
| 4,728,591 A * | 3/1988 | Clark et al. | 430/5 |
| 5,338,430 A * | 8/1994 | Parsonage et al. | 204/412 |
| 5,352,651 A * | 10/1994 | Debe et al. | 503/227 |
| 5,374,472 A * | 12/1994 | Krishnan | 428/216 |
| 5,387,462 A * | 2/1995 | Debe | 428/323 |
| 5,459,016 A * | 10/1995 | Debe et al. | 430/201 |
| 6,004,494 A * | 12/1999 | Debe | 264/104 |
| 6,365,059 B1 * | 4/2002 | Pechenik | 216/52 |
| 6,372,364 B1 * | 4/2002 | Hunt et al. | 428/607 |
| 6,541,392 B2 * | 4/2003 | Avniel et al. | 438/762 |
| 6,692,568 B2 * | 2/2004 | Cuomo et al. | 117/84 |
| 6,784,085 B2 * | 8/2004 | Cuomo et al. | 438/604 |
| 6,787,198 B2 * | 9/2004 | Mukherjee et al. | 427/526 |
| 6,803,244 B2 * | 10/2004 | Diener et al. | 438/22 |
| 6,834,149 B1 * | 12/2004 | Dietz et al. | 385/122 |
| 6,853,075 B2 * | 2/2005 | Auner et al. | 257/737 |
| 6,858,521 B2 * | 2/2005 | Jin | 438/551 |
| 6,913,697 B2 * | 7/2005 | Lopez et al. | 210/644 |
| 6,946,410 B2 * | 9/2005 | French et al. | 438/800 |
| 6,992,321 B2 * | 1/2006 | Tungare et al. | 257/40 |
| 6,998,358 B2 * | 2/2006 | French et al. | 438/800 |
| 7,056,751 B2 * | 6/2006 | Faris | 438/11 |
| 7,115,910 B2 * | 10/2006 | Dutta | 257/80 |
| 7,132,678 B2 * | 11/2006 | Kagan et al. | 257/40 |
| 2004/0033942 A1 * | 2/2004 | Jackson et al. | 514/12 |
| 2004/0195202 A1 * | 10/2004 | Pechenik | 216/2 |
| 2005/0181587 A1 * | 8/2005 | Duan et al. | 438/551 |
| 2006/0145326 A1 * | 7/2006 | Tran | 257/680 |
| 2006/0211183 A1 * | 9/2006 | Duan et al. | 438/149 |
| 2006/0260674 A1 * | 11/2006 | Tran | 136/252 |
| 2007/0012980 A1 * | 1/2007 | Duan et al. | 257/296 |

FOREIGN PATENT DOCUMENTS

| | | |
|---|---|---|
| FR | 2 689912 | 10/1993 |
| JP | 2000091627 A * | 3/2000 |

OTHER PUBLICATIONS

English Machine Translation and Abstract for JP JP02000091627A.*

Romanov et al, "GeSi Films With Reduced Dislocation Density Grown by Molecular-Beam Epitaxy on compliant Substrates Based on Porous Silicon" Applied Physics Letter, etc., vol. 75, No. 26, Dec. 27, 1999, pp. 4118-4120.

Sanchez et al, "Structural and Morphological Characteristics of InGaAs/GaAs Quantum Well Structures on Tilted (111) BGaAs Grown by MBE", Journal of Crystal Growth etc., vol. 192, No. 3-4, Sep. 1, 1998, pp. 363-371.

* cited by examiner

METHOD OF ALTERING THE PROPERTIES OF A THIN FILM AND SUBSTRATE IMPLEMENTING SAID METHOD

This application is a filing under 35 USC 371 of PCT/FR2003/001423 filed May 7, 2003.

BACKGROUND OF THE INVENTION

The present invention relates to the field of producing substrates comprising at least one thin layer formed on the surface of a support, such substrates being utilised in the fields of microelectronics, nanoelectronics or microtechnology, nanotechnology in a general sense.

The present invention has particularly advantageous applications in the field of materials having electronic, optoelectronic, supra-conductor or piezoelectric functions for example.

For instance, certain electronic and optoelectronic applications can necessitate the use of ternary or quaternary semi-conductor materials. However, the number of these ternary and quaternary materials of high structural quality possible to obtain by epitaxial growth is limited as it is rarely possible to find a substrate whereof the crystalline network is adapted to that of the semiconductor layer to be grown. Consequently, heteroepitaxy carried out in lattice conflict causes formation of a significant quantity of structural defects beyond a critical thickness, which then causes irreversibly undesirable modifications of the expected physical properties of the epitaxied layers. Furthermore, the use of strained compound or simple semiconductor layers can be for profiting from the improvement of certain properties. There again, the use of a technique for deforming the layers homogeneously would be an advantage.

To try to eliminate these problems, growth techniques have been developed including producing buffer layers whereof the objective is to absorb the strains induced by the difference in the lattice parameters between the substrate and the epitaxied thin layer.

A first family of techniques aims at using compliant substrates consists of producing epitaxy in conflict with lattice on a fine membrane, serving as a nucleus layer. The strain energy is thus supposed to be relaxed elastically or plastically by the membrane.

By way of example a technique of elastic compliance of a nucleus membrane has been described by S. I. Romanov et al., Appl. Phys. Lett. 75, (1999) p. 4118.

This technique consists of:
porosifying the surface of a substrate of Si so as to form two porous layers with specific upper surface, with the surface layer presenting low porosity while the latter which is inserted between the surface layer and the substrate exhibits increased porosity,
lightly oxidising (maximum monolayer) the surface of the resulting substrate so as to mechanically stabilise the crystallites,
deoxidise the substrate in the growth structure just prior to epitaxy of a fine layer of Si, and
producing growth in conflict with lattice of a layer of SiGe on the fine layer of Si.

The process described by Romanov et al thus comprises generating epitaxial growth in conflict with lattice on a membrane of Si obtained on porous Si. An effect of compliance (deformation) of the porous layers seems to be observed.

Different studies on the compliant substrate have been carried out. The article by A. M. Jones, Appl. Phys. Lett. 74, (1999) p. 1000 can be cited by way of example, describing a growth technique on a free membrane aimed at depositing on a substrate two layers, namely a first layer which is called sacrificial and then the fine membrane on which epitaxy is performed. The sacrificial layer is a layer whereof the chemical attack speed for a solution is considerable before that of the membrane. A lithographic step is taken to have only one disc of the membrane subsist at the surface of the sample which is then dipped in the chemical attack solution. The sacrificial layer is etched, including under the disc, by sub-etching. The chemical attack is stopped when there is only one pillar remaining to carry the disc of the membrane on which is formed the growth of an epitaxied layer. The membrane is thus capable of deforming to limit the deformations of the epitaxied layer. The advantage of this method is that the epitaxied layer strain is relatively well relaxed elastically. However, this method has a number of disadvantages such as fragility of the structure, non-planarity of the surfaces, difficulty of the production process and the small size of the zones obtained.

A method of misaligned fusion or << twist bonding >> can also cited, as described especially in the article by Y. H. Lo, Appl. Phys. Lett. 59, (1991) p. 2311, transferring a membrane strain or not, on a substrate host by ensuring the generation of a rotation between the crystallographic directions of the membrane and that of the substrate. This creates a network of dislocations at the interface between the membrane and the substrate. This produces a growth of a strain layer on the membrane. Under the effect of the strain energy the dislocations are supposed to change orientation to take on a corner character and thus minimise this energy. The advantage of this technique bears on the transfer of the membrane on the totality of the substrate. However, there is no guarantee of the resulting relaxation and there are doubts on the homogeneity of the resulting relaxation.

By way of example also the technique of molecular adhesion or << wafer bonding >> can be cited, as described especially in the article by D. M. Hansen et al., J. Cryst. Growth. 195, (1998) p. 144, aiming at transferring a membrane by molecular adhesion on a surface-oxidised substrate. The growth of the layer strain is then produced on the membrane. The atoms of the membrane presented at the interface can effect slight displacements for relaxing the strain layer. The principal advantage of this technique is the large size of the resulting surfaces. All the same, even if a compliance effect is observed, the relaxation is not total. The critical thicknesses of the deposited layers are increased, but it is still not possible to produce thick layers exempt from structural defects.

All these compliance plastic or elastic techniques do not exhibit the expected characteristics. Plastic or elastic deformation of the nucleus layer by the epitaxial layer is not or is only partially observed. On the other hand, the lateral dimensions of the resulting zones exempt from defects are too slight.

In the prior art, another family of known solutions relates to the paramorphic technique consisting of undertaking epitaxy of a strain membrane then of having it relax elastically to then undertake epitaxy commensurate with lattice. The aim of this technique is to successively deposit on a substrate a sacrificial layer and a strain membrane via epitaxy. A lithographic stage then selectively etches the membrane to produce the discs. Humid chemical etching is carried out to totally etch the sacrificial layer, including under the discs by sub-etching. The strain membrane relaxes elastically while it is no longer maintained. This strain membrane is then deposited on the substrate. The principal advantage of this technique comes from reprise of growth commensurate with lattice. However, the discs obtained are limited in size (a few hundred microns) and the conflicts of the initial parameters of the membrane are low (1% environ).

Another family of solutions described by D. S. Cao., J. Appl. Phys. 65, (1989) p. 2451 is the metamorphic method with use of buffer layers of fixed or gradual compositions or even super-networks. The buffer layers have a lattice parameter which is different to that of the substrate. Growth of these layers is generated for thicknesses greater than the critical thickness. The buffer layer thus relaxes via generation of dislocations and retrieves its non-strained lattice parameters. The growth of the desired active layer is thus realised on these buffer layers of lattice parameters different to those of the original substrate. The first difficulty of this technique originates from confinement of the dislocations in the buffer layer which is not total, emerging dislocations always being presented in the active layer degrading the properties of the latter. The second originates from the appearance of coarseness at the surface of the buffer layer which can degrade the expected properties of the active layer.

The prior art has also proposed via document JP 2000 0091 627 a technique for manufacturing light emitters consisting of making a deposit of a polycrystalline material with fine grains, followed by thermal treatment. This annealing allows atomic rearrangement which leads to the increase of grain size. However, this technique gives no guarantee for homogeneity of reorganisation and does not generate epitaxial growth of any layer commensurate with lattice with its substrate.

The result of analysis of the different techniques known to date is the observation that they do not give satisfaction in practice. There is the apparent need to be able to utilise a technique effecting the epitaxial growth of any layer commensurate with lattice with its substrate.

SUMMARY OF THE INVENTION

The applicant has expressed the need to be able to make use of a technique for modifying the lattice parameters of a substrate to allow epitaxy commensurate with lattice of alloys having at least two chemical elements. To satisfy this need, the applicant proposes a technique for modifying the lattice parameter of a thin layer, strain or not, made directly or indirectly on a support together forming a substrate. More generally, this technique allows not only the lattice parameter to be modified, but also various other properties of a thin layer deposited on the surface of a support forming a substrate able to be used in the field of microelectronics, nanoelectronics or microtechnology, nanotechnology.

The object of the invention relates to a process for modifying the properties of a thin layer. The process according to the invention consists of:

forming at least one thin layer on a nanostructured support with specific upper surface, and treating the nanostructured support to generate internal strains in the support causing its deformation at least in the plane of the thin layer so as to ensure corresponding deformation of the thin layer to modify its properties.

According to a preferred variant embodiment the process consists of treating the nanostructured support with specific upper surface chemically to ensure deformation corresponding to a dilation or contraction of, its nanostructure.

According to a characteristic of the invention the process consists of selecting a nanostructured support with specific upper surface from among diverse nanostructures based on metals, semi-conductors or dielectric materials.

According to preferred variant embodiment the process consists, after treatment of the nanostructured support with specific upper surface, of generating on the thin layer epitaxial growth of a crystalline material.

Preferably, the process consists of selecting a thin layer capable of having after treatment of the nanostructured support with specific upper surface a lattice parameter corresponding to the lattice parameter of the crystalline material to be formed by epitaxial growth on said thin layer.

Preferably, the process consists of forming on the nanostructured support with specific upper surface a thin layer prestrained or not.

According to a variant embodiment the process consists of forming on the nanostructured support with specific upper surface at least one intermediate layer between the thin layer and the nanostructured support with specific upper surface.

Advantageously, the process consists of forming on the thin layer the epitaxial growth of a crystalline material selected from among semiconductor, magnetic or supra-conductor materials.

Advantageously still, the process consists of forming on the nanostructured support with specific upper surface a thin layer made of a material having piezoelectric properties.

According to a variant embodiment, the process consists of effecting on the thin layer a lithographic operation to have piezoelectric zones-appear.

According to another variant embodiment the process consists of deforming the nanostructured support with specific upper surface so that electrical charges appear at the level of the thin layer.

Another object of the invention is to propose a substrate for microelectronics, nanoelectronics or microtechnology, nanotechnology, formed by a nanostructured support with specific upper surface and deformed following treatment and on the surface of which is at least one thin layer deformed corresponding to the support.

Advantageously, the substrate comprises an epitaxial layer of a crystalline semiconductor, magnetic or supra-conductor material, formed on the thin layer.

Advantageously, the substrate comprises a thin layer made of an piezoelectric material.

Another object of the invention focuses on the application of the substrate to creating an optoelectronic element.

Another object of the invention focuses on the application of the substrate to creating an electronic component.

BRIEF DESCRIPTION OF THE DRAWINGS

Various other characteristics will emerge from the following description in reference to the attached diagrams which show, by way of non-limiting examples, embodiments of the object of the invention.

DESCRIPTION OF PREFERRED EMBODIMENTS

Figure 1:
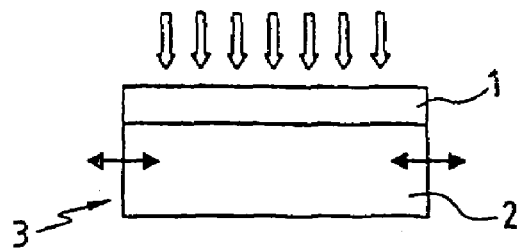
FIG. 1 illustrates a substrate to which is applied the process according to the present invention.

As evident from FIG. 1, the object of the invention relates to a process for modifying the properties of a thin layer 1 created on the planar surface of a support 2 forming a substrate 3 for use in the fields of microelectronics, nanoelectronics or microtechnology, nanotechnology.

The process according to the invention consists of taking a nanostructured support 2 presenting a specific upper surface, that is, a support which contains at least one layer constituted by nanocrystallites and/or nanoparticles of various geometric shapes interconnected between one another and whereof at least one dimension is less than or equal to 1,000 nm and whereof the sum of the surfaces of each nanocrystallite and/or nanoparticle is greater than the planar surface occupied by said layer. Diverse nanostructured materials can utilised to make up the nanostructured support 2 according to the invention, for example:

nanostructures with specific upper surface based on metals or semi-metals, semi-conductor nanostructures with specific upper surface such as for example porous silicon or other semi-conductor nanostructures of type IV, IV-IV, III-V, II-VI, etc., or nanostructured dielectric materials with specific upper surface based on $TiO_2$ (anatase, rutile), $Al_2O_3$, ZnO, etc.

The process according to the invention aims to form or effect on the planar surface of the nanostructured support 2 at least one strain thin layer 1. This strain thin layer 1 is either attached directly or indirectly to the nanostructured support 2 by means for example of adhesion utilising molecular adhesion means, or deposited by any method, or made from the nanostructured support 2.

The thin layer is made of a material dependent on the application envisaged for the substrate 3, such as, for example, a metal, a dielectric, a semi-conductor or a polymer of any types.

The process according to the invention then aims at treating the nanostructured support 2 to generate internal strains in the support, causing its deformation at least in the plane of the thin layer 1 so as to modify its properties. The nanostructured support 2 is treated so as to change its volume, that is, to dilate it or to contract it such that the thin layer 1 subjects the interface between the nanostructured support 2 and the thin layer 1 to the same deformation as the nanostructured support 2. The thin layer 1 is then in tension or compression.

It must be understood that the internal strains generated in the nanostructured support 2 by the treatment then relax, partially or completely, by deformation of the nanocrystallites and/or nanoparticles on a nanometric scale causing macroscopic deformation of the nanostructured support 2.

The means utilisable to generate these internal strains are multiple and can be used either separately or conjointly. One of these means consists of modifying the physico-chemistry of the nanocrystallites and/or nanoparticles. By way of example, modification of the chemistry of the nanocrystallites causes variations in average interatomic distances of the atoms forming the nanocrystallites. These modifications of a chemical nature translate by internal strains appearing on a nanometric scale which relax by deformation of the nanocrystallites while causing macroscopic deformation of the nanostructured support. Other means consist of filling the void present between the nanocrystallites by inserting material (for example during deposit in vapour phase). This addition of material comprises the nanocrystallites which deform. One of the advantages of this technique is to help modify the global thermal dilation coefficient of the support by selecting the nature of the deposits made between the nanocrystallites so as to have this coefficient correspond to that of the epitaxied layer. The treatment operation of the nanostructured support 2 aimed at assuring its deformation is carried out by any appropriate means, such as chemical, for example.

The process according to the invention thus assists in varying the volume of the nanostructured support 2, using a dilation or contraction effect, so as to ensure the corresponding deformation, namely dilation or contraction of the thin layer 1 at the interface with the support. Such a process modifies the properties of the thin layer 1, such as physical or morphological (variation of the lattice parameter, thickness, . . . ), electrical (raising of the degeneracy of the valence band in the semi-conductor, appearance of charges for the piezoelectric layers, change on dielectric constant, modification of electrical transport properties such as for example the variation in electron and hole mobility in silicon, . . . ), magnetic (change in the Hysteresis cycle with modification of crystalline symmetry for ferromagnetic materials) or optical (modification of the absorption energy of the photons, refraction index, . . . ).

The process according to the invention produces a substrate 3 not having a size limit, while being compatible with the nano- or microtechnologies of collective fabrication of components. This solution also has the advantage of reduced manufacturing costs.

FIGS. 2a to 2d illustrate a first variant embodiment of a substrate 3 produced by the process according to the invention and destined to permit growth of an epitaxial layer commensurate with perfect or quasi-perfect lattice.

Figure 2A:
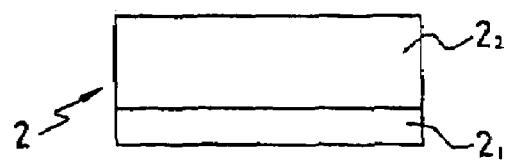
FIGS. 2a to 2d illustrate the different phases of a first example embodiment of a substrate comprising a thin layer adapted to epitaxial growth.
Figure 2B:
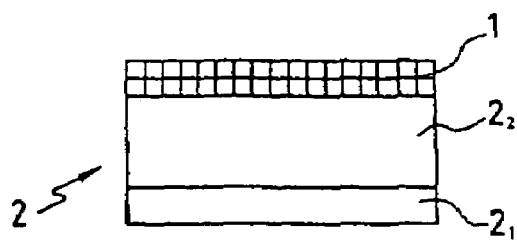

FIG. 2a illustrates a support 2 nanostructured partially by a process enabling the nanometric porosification of its crystalline structure or by a process enabling growth of a nanostructured layer on its surface. The nanostructured support 2 partially comprises a non-nanostructured layer $2_1$ and a nanostructured layer $2_2$. Of course, the layer $2_1$ can be made up of a series of layers of different chemical nature. This layer $2_1$ can be of a different chemical nature or not to the layer $2_2$. This layer $2_1$ can be strained relative to the layer $2_2$ prior to the deformation operation. Similarly, it should be noted that the object of the invention can be implemented with a completely nanostructured support 2.

In the illustrated example, the nanostructured support 2 comprises a layer $2_1$ of monocrystalline silicon and a layer $2_2$ of nanostructured porous silicon. As is evident more precisely from FIG. 2b, a thin layer 1 is produced on the support, that is, on the layer nanostructured porous silicon $2_2$. This thin layer 1 is for example constituted by indium phosphorous (InP) and is made via epitaxy by molecular jets or other.

Figure 2C:
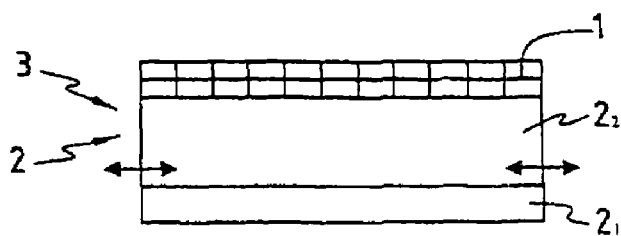
Figure 2D:
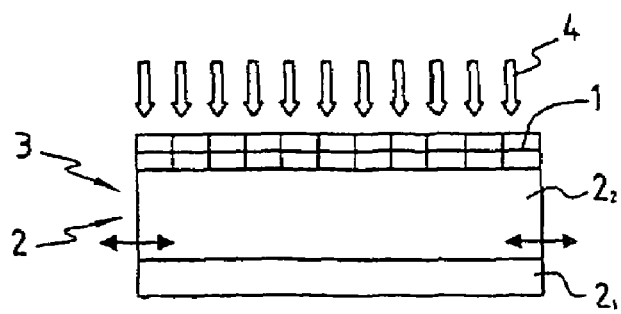

As is evident more precisely from FIG. 2c, the support 2 is subjected to treatment, for example chemical, such as oxidation, hydrogenation or the like, allowing the state of strain in the nanostructured support 2 to be strongly modified, causing dilation or contraction of its nanostructure. This dilation or contraction of the nanostructured support 2 causes corresponding dilation or contraction of the thin layer 1 at the interface with the nanostructured support 2. The contraction or dilation of the nanostructured support 2 respectively diminishes or augments the lattice parameter of the thin layer 1 in the plane of the interface.

The process according to the invention then consists of processing at an epitaxy 4 for example in perfect lattice accord on the free surface of the deformed thin layer 1. For example, epitaxy of a layer of InGaAs can be undertaken on a thin layer of deformed InP.

Figure 3:
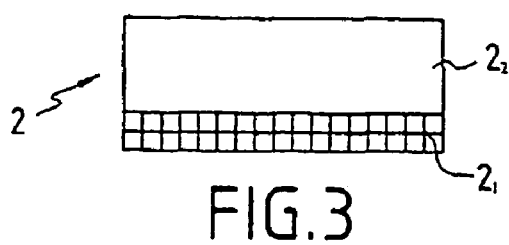
FIGS. 3, 3a, 4a, 5a illustrate the different phases of a first variant embodiment of a substrate utilising the process according to the present invention.
Figure 3A:
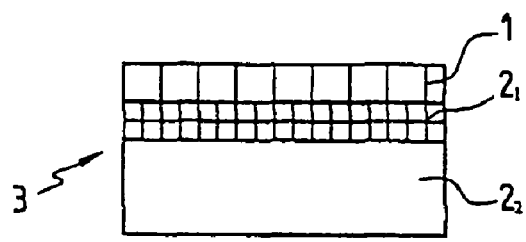
Figure 3B:
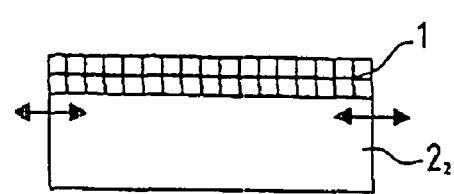
FIGS. 3b and 4b illustrate the different phases of a second variant embodiment of a substrate using the process according to the present invention.
Figure 4A:
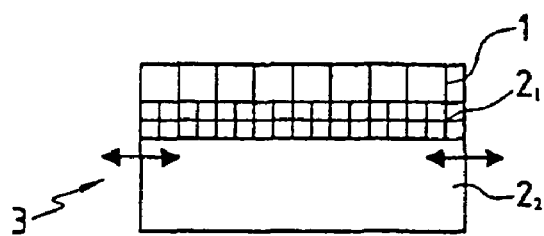
Figure 4B:
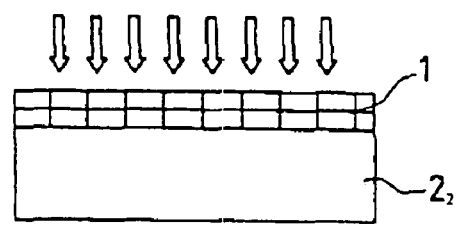
Figure 5A:
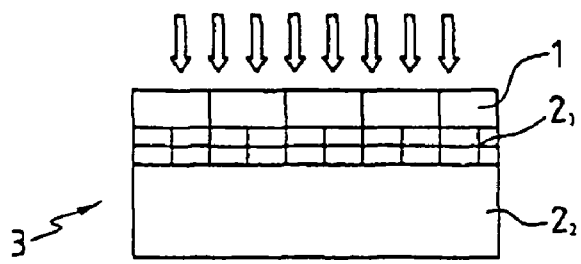

FIGS. 3, 3b and 4b illustrate another example embodiment of a substrate implementing the process according to the invention and focussed on eliminating the assembly stage of the nanostructured support with the thin layer. As is evident more precisely in FIG. 3, the support 2 is nanostructured partially by a process allowing nanometric porosification of a part of its crystalline structure or by a process allowing the growth of a nanostructured layer. The support 2 comprises a non-nanostructured layer $2_1$ and a nanostructured layer $2_2$. This layer $2_1$ can be strained relative to the layer $2_2$ prior to the deformation operation. What is more, the layers $2_1$ and $2_2$ can be of a different chemical nature or not. For example, the support 2 comprises a layer $2_1$ of monocrystalline silicon-germanium ($Si_xGe_{1-x}$) and a layer $2_2$ of nanostructured silicon. The layer $2_1$ of monocrystalline $Si_xGe_{1-x}$ is controlled in thickness so as to constitute the thin layer 1. As is evident more precisely from FIG. 3b, such a nanostructured support is treated to ensure its deformation, so as to assure corresponding deformation of the thin layer 1 of monocrystalline $Si_xGe_{1-x}$. As explained hereinabove, this deformation operation has the lattice parameter of the thin layer 1 of monocrystalline $Si_xGe_{1-x}$ vary in the plane of the interface enabling as illustrated in FIG. 4b an epitaxy operation 4 of a crystalline material such as GaAs commensurate with lattice.

FIGS. 3a to 5a illustrate another variant embodiment for carrying into effect the process according to the invention from a nanostructured support 2 described in FIG. 3 also aimed at creating the thin layer 1 above at least one intermediate layer of monocrystalline silicon $2_1$ of the nanostructured support 2. The criteria for selecting the thickness of this intermediate layer $2_1$ are the same as for the thin layer 1. A thin layer 1, for example indium phosphorous, is formed on this intermediate layer $2_1$ of monocrystalline silicon. According to FIG. 4a, such a support 2 is treated to ensure its deformation permitting modifying of the lattice parameter of the thin layer 1 of indium phosphorous. Of course, the lattice parameter of the layer $2_1$ of silicon monocrystalline has also changed. As is evidenced more precisely in FIG. 5a, epitaxy 4 of a crystalline material such as an InGaAs layer can be undertaken on the thin layer 1 of indium phosphorous. This variant can be utilised if producing the thin layer 1 is easier on the layer of monocrystalline silicon $2_1$ than on the layer of porous nanostructured silicon $2_2$. In general, it is evident that in the case where the nanostructured support 2 is partially nanostructured, the layer $2_2$ represents the nanostructured part of the support and the layer $2_1$ represents the non-nanostructured part.

As is evident from the preceding description, the thin layer 1 is selected so a to have, after treatment of the nanostructured support 2, a lattice parameter corresponding to the lattice parameter of the crystalline material to be formed by epitaxial growth on said thin layer 1. It should be noted that the thin layer 1 can be formed or made on the nanostructured substrate 2 in the prestrained form or not. In addition, the thin layer 1 is formed or made on a support 2 not yet or already nanostructured.

The thin layer 1 has a thickness determined as a function of two criteria:
  the thin layer 1 must be of a sufficiently slight thickness before the nanostructured support 2 to prevent, after deformation, excessive curving of the substrate (nanostructured support and thin layer),
  the thin layer must be of a sufficiently slight thickness so that deformation is generated by structural defects and thus remains elastic in nature.

Generally, the nature of the thin layer will be selected relative to the modified physical properties expected after deformation. In the particular case of heteroepitaxy, the material constituting the thin layer 1 will be selected as a function of the material which must be epitaxied hereinabove so that its lattice parameters are the closest possible to one another.

For example, the thin layer 1 can have deposited on it polymers or epitaxial growth of a crystalline material selected from amongst the materials:
  Semiconductor such as:
    Family IV-IV: Si, Ge, $Si_xGe_{1-x}$, SiC, $Si_xGe_yC_{1-x-y}$
    Family III-V: $Ga_xAl_{1-x}As$, $Ga_xIn_{1-x}As$, $Al_xIn_{1-x}As$, $Ga_xIn_{1-x}As_yP_{1-y}$, $Ga_xAl_{1-x}P$, $Ga_xAl_{1-x}N$, $Ga_xIn_{1-x}N$, $Ga_xIn_{1-x}Sb$, $Ga_xAl_{1-x}Sb$, $(Ga_xIn_{1-x})_{1-y}Tl_yAs$, $(Ga_xIn_{1-x})_{1-y}Tl_yP$,
    Family II-VI: $Zn_xCd_{1-x}Te_ySe_{1-y}$, $Cd_xHg_{1-x}Te$
  Supra conductor such as YbaCuO.
  Magnetic materials such as:
    ferromagnetic materials such as: iron, cobalt, nickel, as well as their alloys and some rare earths,
    paramagnetic materials.

As is evident from the preceding description the object of the invention relates to a process allowing the properties of a thin layer 1 previously created on a nanostructured support 2 to be modified by deforming it to cause corresponding deformation of the thin layer.

This process produces a substrate comprising a nanostructured support 2 deformed following treatment and on the surface of which is formed at least one thin layer 1 deformed in correspondence to the support. Such a substrate is to comprise a thin layer of any material forming the thin layer 1. An application of this substrate is the realisation of electronic components for profiling modified properties contributed by the deformation of the thin layer 1. Another possible application of such a substrate is to make up an optoelectronic element by utilising the possibility of modifying the optical properties of the thin layer obtained by deformation of its structure.

Figure 6A:
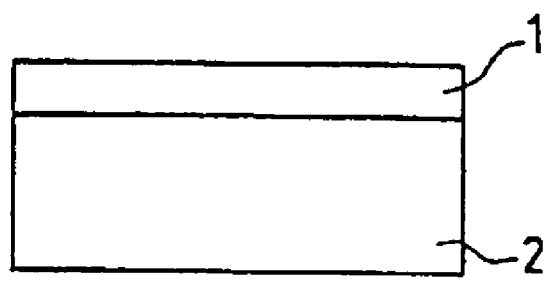
FIGS. 6a, 6b, 6c illustrate the different characteristic phases of the process according to the present invention used for a piezoelectric material.
Figure 6B:
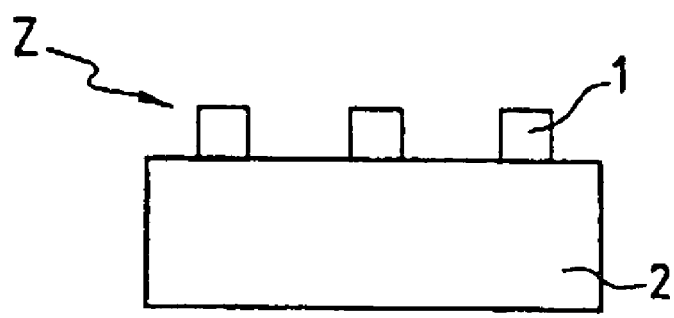
Figure 6C:
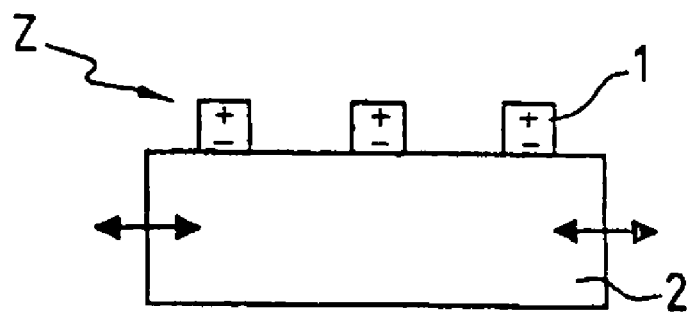

FIGS. 6a to 6c illustrate another example of application of the process according to the invention allowing the piezoelectric properties of a thin layer to be used.

According to this application example, the process consists of forming on a nanostructured support 2 at least one thin layer 1 made of a material having piezoelectric properties. A lithographic operation is then realised on this thin layer 1 to have piezoelectric zones z subsist such as is evident more precisely in FIG. 6b. It should be noted that different types of lithographic operations such as optical, electronic or X rays could be employed.

Treatment of such a nanostructured support 2 to ensure its deformation such as described hereinabove leads to corresponding deformation of the thin layer 1 allowing electrical charges to appear at the level of the thin layer and especially at the level of the piezoelectric zones 3 such as is clearly evident in FIG. 6c. It is noteworthy that the lithographic operation can be carried out after the treatment operation of the nanostructured porous support 2 causing its deformation.

The process according to the present invention also produces a substrate for microtechnology or nanotechnology. In this way, in the case where the thin layer 1 formed on the nanostructured support is made: of a piezoelectric material, elements of controlled form can be obtained by using piezoelectric properties.

The invention is not limited to the examples described and illustrated since various modifications can be made without departing from the scope of the invention.

The invention claimed is:

1. A process for forming a substrate to be utilized in microelectronics, nanoelectronics, microtechnology or nanotechnology comprising a support having a thin layer formed on an upper surface thereof, comprising the steps of:
  forming at least one said thin layer on the upper surface of a nanostructured support, and subsequently treating the nanostructured support to generate internal strains in the support, causing deformation of the support by dilation or contraction at least in the plane of the thin layer, so as to ensure a corresponding deformation of the thin layer and modification of properties of the thin layer.

2. The process as claimed in claim 1, wherein the treating comprises treating the nanostructured support chemically to cause deformation of the nanostructure thereof.

3. The process as claimed in claim 1, wherein the nanostructured support is selected from the group consisting of a metals, semi-conductors and dielectric materials.

4. The process as claimed in claim 1, additionally comprising effecting the epitaxial growth of a crystalline material on the thin layer, after the treating.

5. The process as claimed in claim 4, wherein the thin layer is selected to be capable of possessing a lattice parameter corresponding to a lattice parameter of a crystalline material to be formed by said epitaxial growth.

6. The process as claimed in claim 5, wherein the thin layer is prestrained.

7. The process as claimed in claim 1, additionally comprising forming on the nanostructured support at least one intermediate layer disposed between the thin layer and the nanostructured support.

8. The process as claimed in claim 4, wherein the crystalline material is semi-conductor or superconductor material.

9. The process as claimed in claim 1, wherein the thin layer is made of a material having piezoelectric properties.

10. The process as claimed in claim 9, additionally comprising performing a lithographic operation on the thin layer to reveal piezoelectric zones.

11. The process as claimed in claim 9, addtionally comprising deforming the nanostructured support so that electrical charges appear in the thin layer.

* * * * *